(12) United States Patent
Ockenfuss

(10) Patent No.: US 8,480,865 B2
(45) Date of Patent: Jul. 9, 2013

(54) RING CATHODE FOR USE IN A MAGNETRON SPUTTERING DEVICE

(75) Inventor: Georg J. Ockenfuss, Santa Rosa, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 265 days.

(21) Appl. No.: 13/087,301

(22) Filed: Apr. 14, 2011

(65) Prior Publication Data

US 2011/0253529 A1 Oct. 20, 2011

Related U.S. Application Data

(60) Provisional application No. 61/325,162, filed on Apr. 16, 2010.

(51) Int. Cl.
*C23C 14/34* (2006.01)

(52) U.S. Cl.
USPC ............ 204/298.27; 204/298.17; 204/298.19; 204/298.11; 204/298.14; 204/298.23; 204/298.28

(58) Field of Classification Search
USPC ............ 204/298.17, 298.19, 298.23, 298.27, 204/298.28, 298.11, 298.14
See application file for complete search history.

(56) References Cited

U.S. PATENT DOCUMENTS

| | | | |
|---|---|---|---|
| 4,610,774 A | 9/1986 | Sakata et al. | 204/298 |
| 4,927,515 A | 5/1990 | Keith | 204/298.21 |
| 5,366,607 A | 11/1994 | Lal et al. | 204/298.19 |
| 5,597,459 A | 1/1997 | Altshuler | 204/192.12 |
| 6,719,886 B2 | 4/2004 | Drewery et al. | 204/298.18 |
| 2006/0151312 A1 | 7/2006 | Scherer et al. | 204/192.12 |

*Primary Examiner* — Rodney McDonald
(74) *Attorney, Agent, or Firm* — Matthew A. Pequignot; Pequignot + Myers LLC

(57) ABSTRACT

The present invention relates to a magnetron sputtering device including a large ring cathode having a defined inner radius. The position of the ring cathode is offset in relation to a center point of a planetary drive system. An anode or reactive gas source may be located within the inner radius of the ring cathode. Lower defect rates are obtained through the lower power density at the cathode which suppresses arcing, while runoff is minimized by the cathode to planet geometry without the use of a mask.

21 Claims, 16 Drawing Sheets

RING CATHODE FOR USE IN A MAGNETRON SPUTTERING DEVICE

CROSS-REFERENCE TO RELATED APPLICATIONS

This application claims priority from U.S. provisional application No. 61/325,162 filed 16 Apr. 2010, which is incorporated herein by reference for all purposes.

FIELD OF THE INVENTION

This invention relates generally to a magnetron sputtering device for depositing materials onto substrates in which the deposited films have a predictive thickness distribution with low defect levels. More particularly the invention relates to a ring cathode for use in a magnetron sputtering device and a magnetron sputtering device incorporating the same.

BACKGROUND OF THE INVENTION

Sputter coating is a widely used technique for depositing a thin film of material on a substrate. In a sputtering deposition process ions are usually created by collisions between gas atoms and electrons in a glow discharge. The ions are accelerated into the target of coating material at the cathode by an electric field causing atoms of the target material to be ejected from the target surface. A substrate is placed in a suitable location so that it intercepts a portion of the ejected atoms. Thus, a coating of target material is deposited on the surface of the substrate. In reactive sputtering a gaseous species is also present at the substrate surface and reacts with, and in some embodiments combines with, the atoms from the target surface to form the desired coating material.

In operation, when the sputter gas, e.g. argon, is admitted into a coating chamber, a DC voltage applied between the cathode and the anode ionizes the argon into a plasma, and the positively charged argon ions are attracted to the negatively charged cathode. The ions strike the target in front of the cathode with a substantial energy and cause target atoms or atomic clusters to be sputtered from the target. Some of the target particles strike and deposit on the wafer or substrate material to be coated, thereby forming a film.

To attain increased deposition rates and lower operating pressures, magnetically enhanced cathodes are used. In a planar magnetron, the cathode includes an array of permanent magnets arranged in a closed loop and mounted in a fixed position in relation to the flat target plate of coating material. Thus, the magnetic field causes the electrons to travel in a closed loop, commonly referred to as a "race track", which establishes the path or region along which sputtering or erosion of the target material takes place. In a magnetron cathode, a magnetic field confines the glow discharge plasma and increases the path length of the electrons moving under the influence of the electric field. This results in an increase in the gas atom-electron collision probability, thereby leading to a much higher sputtering rate than that obtained without the use of magnetic confinement. Furthermore, the sputtering process can be accomplished at a much lower gas pressure.

Typically a magnetron sputtering system is operated at a pressure of $2*10^{-2}$ Pa $-1*10^{-1}$ Pa. during sputtering. To establish this pressure, typically the chamber is pumped down to a pressure of $<1*10^{-4}$ and a controlled flow of a gas, typically Argon (and in case of reactive sputtering Argon and Oxygen) is fed into the chamber to maintain the desired pressure. In the case of a diode system, i.e. when no magnets are used, a pressure of $>2$ Pa. is required to be able to ignite and sustain a plasma. High pressure has the disadvantage that the mean-free path is greatly reduced, which causes extensive gas scatter. This results in hazy coatings.

It is desired to create a magnetron sputtering system that increases coating rate and product uniformity across an individual substrate, from substrate to substrate and from run to run.

Cathode geometry, particularly the relationship between the cathode shape, position and dimensions and the objects to be coated, has a significant effect on the rate of deposition and the area coated, as well as product quality and consistency. Variation in layer thickness across a substrate is referred to as runoff. The runoff can be predicted through modeling. It is desired to provide good film thickness uniformity, low runoff, over large diameter substrates.

In many coating apparatuses masking is used to reduce the coating rate variation to acceptable levels. But over time the masks typically accumulate large amounts of coating material. Once the material on the mask reaches a critical thickness it may flake off and contribute to particles that compromise the coating quality. Also trimming and maintaining such masks are elaborate processes. Furthermore, as masks become coated, they gradually change their shape, which continuously alters the coating distribution. In some instances a significant portion of the sputtered particles is shielded which reduces the material utilization. In the prior art, heavy masking, blocking up to 40% of the coating material, is needed to achieve an acceptable thickness distribution (runoff) of +/−1.5% across a 100 mm wafer. A stable system is required to provide run to run uniformity. It is desired to provide a device that does not use a mask.

The anode provides a charge differential to the negatively charged cathode. This can be provided as simply as an electric charge provided to the chamber walls. However, the sputtered material is also deposited on any surface exposed to the sputtered atoms. If the coating is an electrically insulating material, such as a metal oxide, the build up of the material on other parts of the sputtering apparatus can cause problems. In particular, the build up of an insulating coating on the anode interferes with the ability of the anode to remove electrons from the plasma, as required to maintain the plasma's charge balance. This destabilizes the plasma and interferes with deposition control. Coating build-up will cause the anode location to move to another surface in the system. This instability affects coating quality. Numerous prior art anodes have been proposed to overcome the problems of the anode becoming coated with the coating material. Many prior art anodes function at very high voltages that also increase the problems of arcing, which damages coating quality. A low voltage anode that can provide a stable anode location is important to ensuring consistent coating quality.

An increase coating capacity can be realized through an increase in deposition rates or an increase in load size, or both. To increase deposition rates, it is necessary to increase the power density at the target. However, higher power density leads to an increase in arcing and in some targets, such as silicon, to an increase in target cracking. A larger target allows a higher material removal rate without increasing the power density. Greater efficiency of oxidation of the deposited film can also increase the deposition rate for reactive sputtering. Maintaining runoff limits is a challenge to increasing load size. In a concentric system where the cathode and planetary drive share a common center point, enlarging the planetary drive system for larger or a greater number of substrates requires an increase in throw distance. This increases problems of gas scattering by increasing the probability of particle collision—also called "a reduction of the mean free path."

The result is an increase in surface roughness of the coating, perceived as an increase in scatter or haze. It is desired to increase throughput to greater than 3600 cm2/hr for a 3 micron thick application while maintaining a runoff of +/−0.5%. For some industries capacity to coat a 300 mm substrate is necessary. It is desired to increase capacity without sacrificing coating quality. It is also desired to maintain a low temperature process despite increased power input in order to be able to process temperature sensitive materials.

It is an object of this invention to provide a ring shaped cathode for use in a magnetron sputter coating device having a geometry that provides rapid coating over a large surface area while maintaining high coating quality and minimizing material waste.

It is a further object of this invention to provide a magnetron sputter coating device including a ring shaped cathode geometry that produces high quality coatings without the use of a mask.

It is an object of this invention to provide a magnetron sputter coating device incorporating a ring shaped cathode in combination with a low voltage anode vessel.

It is an object of this invention to provide a ring shaped cathode for use in a magnetron sputter coating device that incorporates an anode vessel at the center of the cathode ring.

It is a further object of this invention to provide a ring cathode for use in a magnetron sputter coating device that incorporates a reactive gas outlet at the center of the cathode ring.

It is an object of this invention to provide a ring shaped cathode for use in a magnetron sputter coating device that incorporates an anode vessel at the center of the cathode ring that can deliver an activated reactive gas.

SUMMARY OF THE INVENTION

The present invention has found a ring cathode geometry that increases coating area and target material efficiency in a magnetron sputtering device with a planetary drive system, where the cathode axis is offset to the planetary drive. The ring cathode geometry and the off-center double rotation system for the substrates allows the realization of excellent coating uniformity across large substrates without the use of masking. Low defect levels are maintained by lowering power density on the cathode.

Accordingly, the invention provides a magnetron sputtering device including:

a planetary drive system having a central rotation axis C for primary rotation, and supporting a plurality of planets, each planet having a secondary axis of rotation at a planet center point $C_s$, and each planet representing a coating area described by $r_w$ the planet radius, the planetary drive system having a carrier radius $r_C$ from the central rotation axis C to a planet center point $C_s$;

a ring shaped cathode including a ring shaped target comprising material for forming a coating, the cathode having a center point Cc, an outer radius $r_2$ greater than the planet radius ($r_2 > r_W$), an inner radius $r_1$ greater than one quarter of the outer radius ($r_2 > r_1 > 1/4 * r_2$);

wherein the cathode center point Cc is disposed an offset distance $r_T$ between 2/3 and 4/3 of the carrier radius $r_C$ from the central rotation axis C ($2/3 * r_C < r_T < 4/3 * r_C$), and the offset distance $r_T$ is greater than one half the outer radius of the cathode ($r_T > 1/2 * r_2$);

and wherein a throw distance h vertically from a target surface to a planet surface is between one third of the outer radius $r_2$ of the cathode and one times the outer radius of the cathode ($1/3 * r_2 < h < r_2$);

a chamber for housing the cathode and the planetary drive system adapted to be evacuated in operation; and a gas delivery system for providing a flow of sputter gas into the chamber.

The invention further comprises a magnetron sputtering device for providing a sputter coating to a substrate without the use of a mask.

In an embodiment of the invention, the magnetron sputtering device described above further includes an activated source for a reactive gas.

In an embodiment of the invention as described above, the activated source for a reactive gas is located at the center of the ring shaped cathode.

In a preferred embodiment the magnetron sputtering device further includes an anode for providing a voltage difference to the cathode, such that the anode is the preferred return path for electrons. The anode comprises an interior conductive surface of a vessel having an insulated outer surface electrically isolated from the chamber walls. The vessel has an opening in communication with a chamber interior, the opening being significantly smaller than a circumference of the vessel to shield the interior conductive surface from most sputtered material. In a further embodiment, a source for sputtering gas is coupled into the vessel for providing sputtering gas through the opening into the chamber, and the opening is dimensioned to permit a flow of gas to increase the pressure locally within the anode vessel above the pressure of the evacuated chamber.

In a further embodiment, the magnetron sputtering device including the anode described above further includes an activated source for a reactive gas.

In a further embodiment the magnetron sputtering device described above, the anode including a source for sputtering gas is located such that the opening of the vessel in communication with the chamber interior is at the center of the ring shaped cathode.

The invention further includes the magnetron sputtering device including an activated source for reactive gas, wherein the anode is located such that the opening of the vessel in communication with the chamber interior is at the center of the ring shaped cathode.

The invention further includes the magnetron sputtering device including the anode as a source for sputtering gas, wherein the activated source for a reactive gas is located at the center of the ring shaped cathode.

In a further embodiment, the magnetron sputtering device including the anode as a source for sputtering gas, wherein the anode further includes a source for a reactive gas coupled into the vessel for providing an activated reactive gas together with the sputtering gas through the opening into the chamber.

In a further embodiment, the magnetron sputtering device above including the anode as a source for sputtering gas and a reactive gas, wherein the opening into the chamber of the vessel comprising the anode is located at the center of the ring shaped cathode.

In a further embodiment, the magnetron sputtering device above including the anode as a source for sputtering gas and a reactive gas located at the center of the ring shaped cathode, further including an auxiliary activated reactive source located a distance from the cathode.

In a preferred embodiment the magnetron sputtering device includes the cathode radius r1/r2 wherein 0.95*r2>r1>0.6*r2.

In a preferred embodiment of the magnetron sputtering device the cathode diameter r2 is equal to or larger than 1.11 times the planet radius ($r2 > 1.11 * r_W$).

In a further embodiment of the invention, the magnetron sputtering device as defined above further includes within the chamber one or more alternate ring shaped cathode including a ring shaped target comprising material for forming a coating, wherein the offset distance $r_T$ is greater than one times the outer radius r2 ($r_T > 1*r2$).

Advantageously, the present invention increases coating uniformity in both runoff and planet to planet results over the prior art. Tolerance to mechanical deviation in vertical and horizontal positioning is significantly relaxed. Thus with close mechanical control significant improvement in planet to planet uniformity can be achieved. This quality control can be maintained over relatively large substrates (300 mm) and despite scale up for increased load, while still maintaining a relatively short throw distance. In accordance with the present invention this uniformity can be achieved without the use of a mask.

BRIEF DESCRIPTION OF THE DRAWINGS

Exemplary embodiments of the invention will now be described in accordance with the drawings, in which.

DETAILED DESCRIPTION

Figure 1:
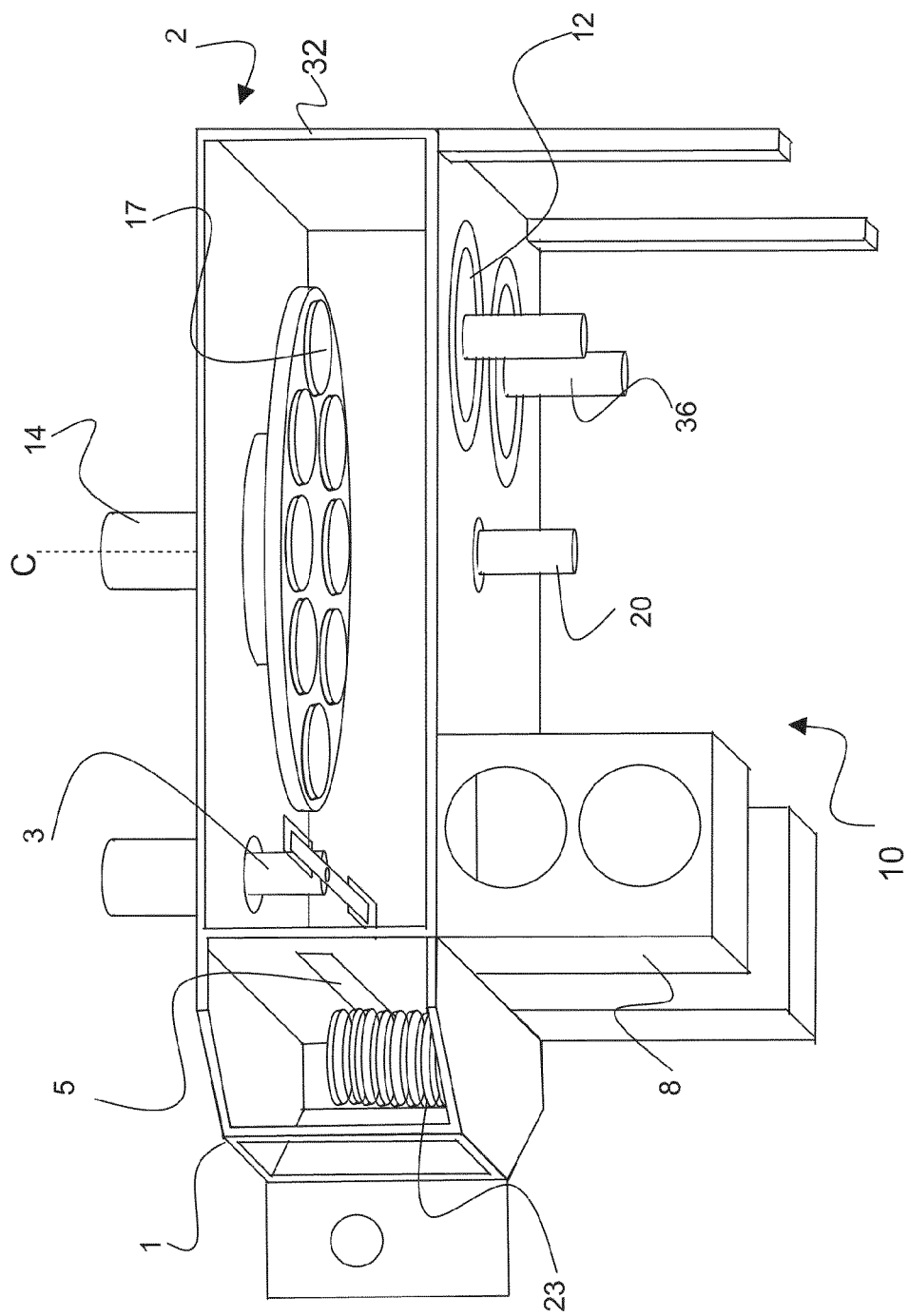
FIG. 1 is an isometric view of the coating system of the present invention with some outer wall removed.
Figure 2B:
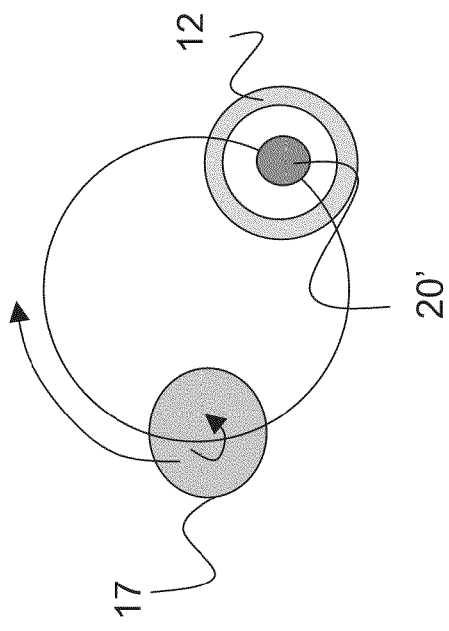
FIG. 2B is a schematic top view of the cathode and anode with activated reactive gas source of FIG. 2A in relation to a planet substrate to be coated.
Figure 2C:
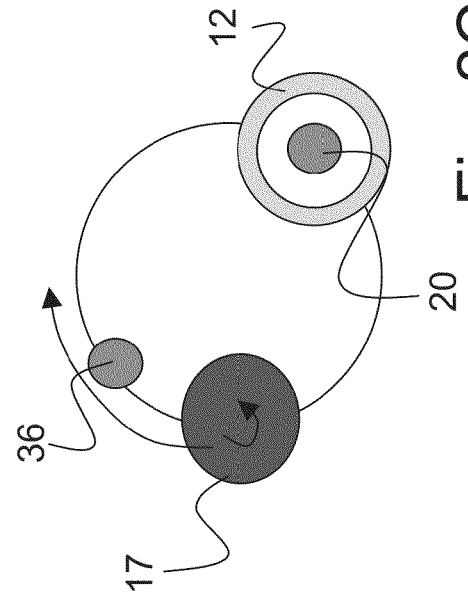
FIG. 2C is a schematic top view of the cathode and anode with a separate radially positioned activated reactive gas source.
Figure 2A:
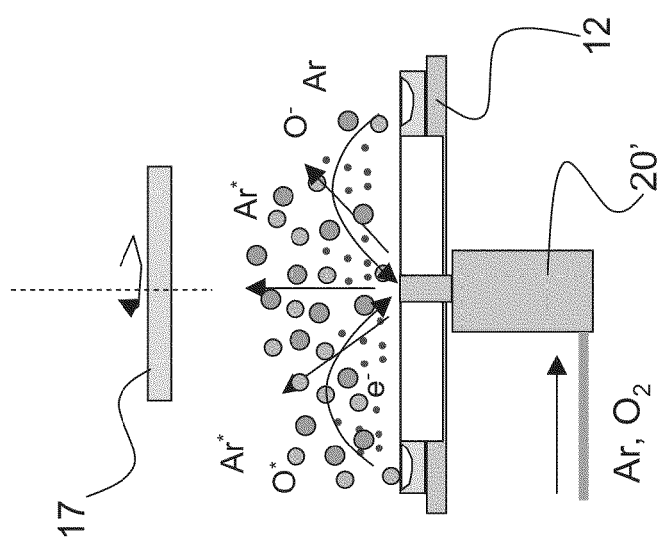
FIG. 2A is a schematic cross-section of a ring shaped cathode incorporating an anode vessel including an activated reactive gas source at its center in relation to a planet substrate to be coated.

An isometric view of the coating chamber 2 of the magnetron sputter coating device 10 is shown in FIG. 1. Pumps 8 evacuate the coating chamber 2 for operation under vacuum conditions, understood to mean where the pressure is below atmospheric pressure. The chamber walls 32 are grounded and isolated from the positively charged anode 20 and the negatively charged cathode 12. A planetary drive 14, seen in more detail in FIGS. 3A and 3B, comprises a carrier 16 or rack rotatable about a central rotational axis C, with a plurality of eg. seven or eight, planets 17 supported radially about the central rotational axis C. A carrier radius $r_C$ is defined between the central axis C and the planet axis Cs. A ring shaped cathode 12, in this embodiment two cathodes 12, are shown each having a central axis Cc that is offset from the central axis C of the planetary drive 14. Anode 20, in the form of a vessel with an opening in communication with the coating chamber 2, is shielded from coating material and averted from a direct line to the target material of the cathode 12. An activated reactive gas source 36 is shown at the center of cathode 12. These positions can be reversed with 36 comprising an anode at the center of the cathode 12 and an activated reactive source 20 disposed a distance from the cathode 12. Although a preferred location for a reactive source 36 is at a radial position $r_C$ from C. as seen in FIG. 2C An alternative embodiment is shown in FIGS. 2A and 2B in which the anode vessel 20' is positioned in the center of the ring cathode 12 functioning also as the source of reactive gas. If the anode 20' is a source of activated reactive gas at the center of the cathode (36 in FIG. 1), an auxiliary activated oxygen source can be located at 20 in FIG. 1, to enable a higher deposition rate. The magnetron sputter coating device 10 includes a load lock 1 for loading and unloading substrates or other objects 23, for coating. This allows the deposition chamber 2 to remain under vacuum conditions at all times. The device is depicted here in the sputter up configuration. However, the geometry of the present invention applies equally to a sputter down, horizontal, or other orientation.

Pulsed DC magnetron sputtering is the preferred process. Alternatively, the invention can also be implemented in DC magnetron, AC magnetron sputtering and rf magnetron sputtering.

Many optical coatings have discriminating features in their spectral response. For example an edge filter for color separation lets one color pass while rejecting other colors. For the purpose of this disclosure the precision requirement across a whole 200 mm or 300 mm substrate for the coating is assumed to be 0.5%. For the example above, if the edge were at 500 nm, this would translate to a 2.5 nm absolute edge placement variation. The placement of the spectral feature is related to the thickness of the layers in the coating design. Thus, the variation in coating rates across the substrate needs to be below 0.5%. If multiple substrates are coated in the same batch, the variation from one substrate to another needs to be a fraction of that. The variation in placement of a spectral feature is also referred to as runoff.

Figure 3A:
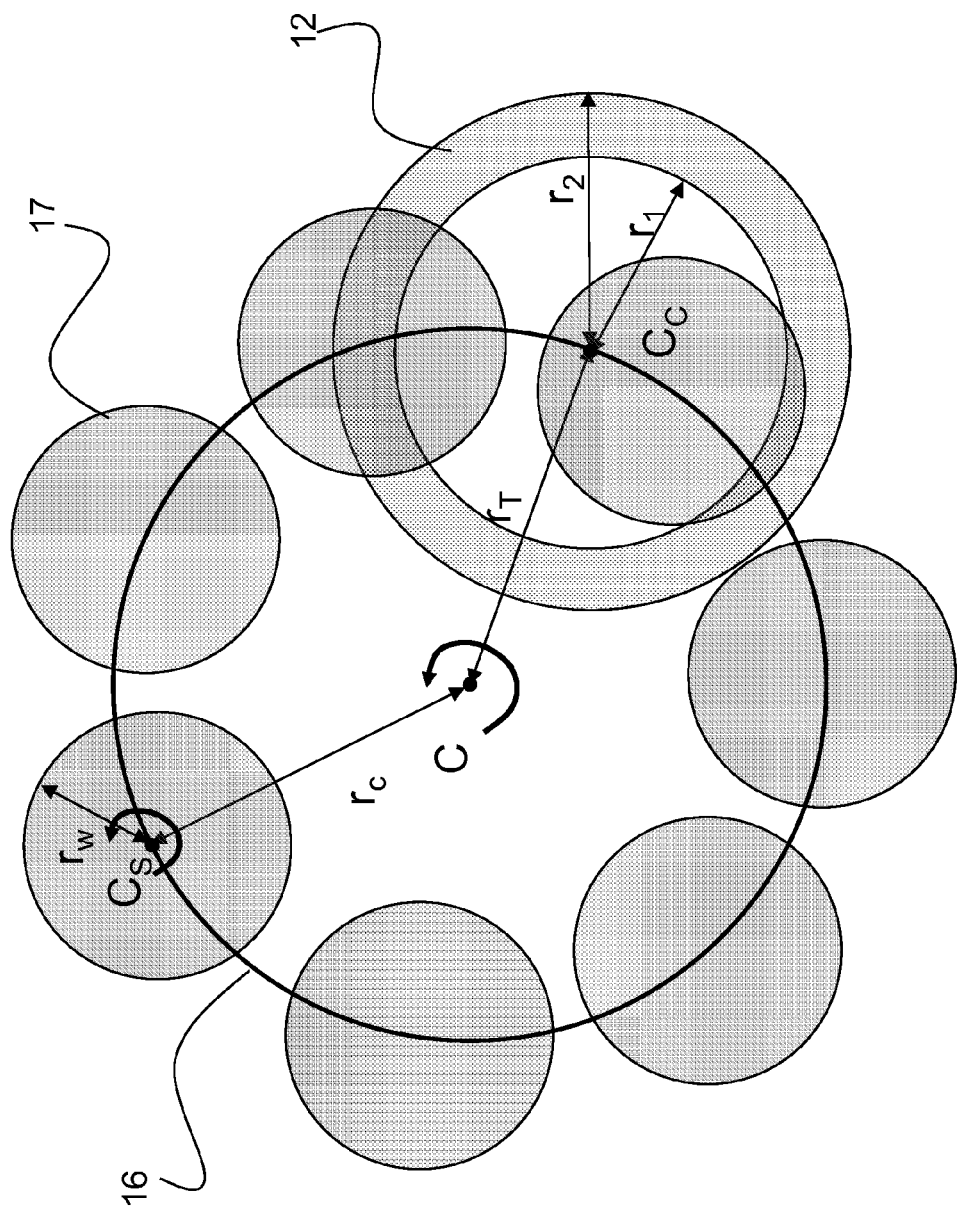
FIG. 3A is a schematic top view of a ring shaped cathode target and planetary substrates in accordance with an embodiment of this invention.
Figure 3B:
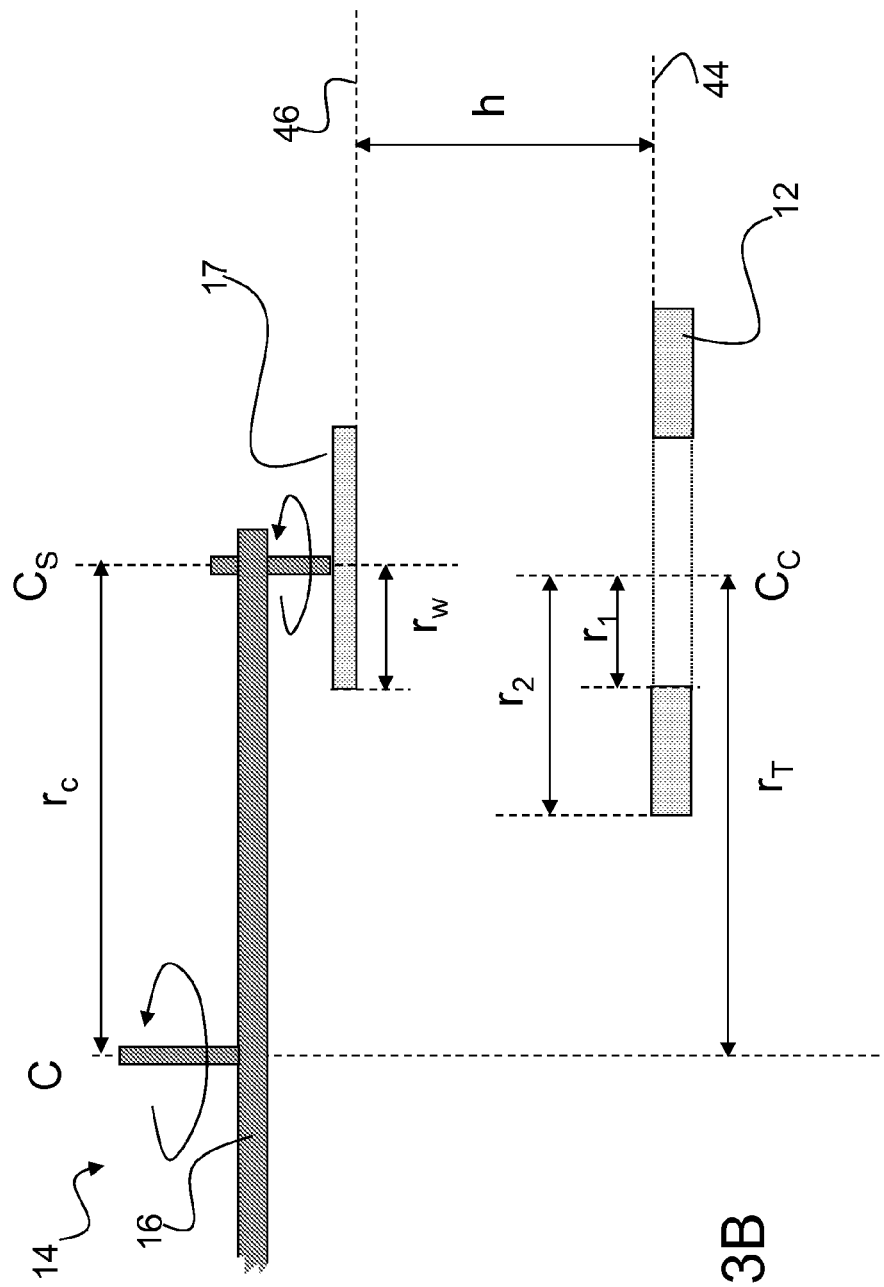
FIG. 3B is a schematic side view of the ring shaped cathode target and planetary substrate drive.

The planetary drive 14 and ring cathode 12 are shown schematically in greater detail in FIGS. 3A and 3B. The planetary drive 14 includes a central axis C about which the drive system rotates, and a plurality of secondary axes Cs, about which each planet 17 rotates independently. The distance between the central axis C and secondary axes Cs is a carrier radius $r_C$. Each planet 17 has a radius $r_W$ that defines a largest usable coating area. The number and size of planets 17 desired determines the size of the planetary drive 14 and the capacity of the device 10.

The planets 17 in a planetary coating geometry are supported at a common distance $r_C$ from the central rotational axis C. Usually it is desired to arrange the planets 17 as closely as possible for best coating material use. Each planet 17 can support single or a plurality of substrates, optical prisms, lenses or other objects 23. The object 23 to be coated can comprise a plurality of smaller separated parts mounted on a support substrate. The planet radius $r_w$ merely defines the usable coating area for each planet 17. A planet 17 in structure need not be this dimension itself, but is able to support a substrate 23 of this radius, or multiple objects 23 to be coated within this area. In a preferred embodiment, large objects such as bulk optics may have a thickness of up to 32 mm. With controlled height adjustment, a well defined target surface to object surface distance results in minimum runoff.

Independent planet rotation may comprise a coordinated rotation rate relative to the rotation about the central rotational axis C. The secondary axes Cs are preferably parallel to the central rotational axis C, but may be at some other angle. Each planet 17 is disposed to experience substantially the same conditions as every other planet 17. Seen clearly in FIG. 3B, an object plane 46 is illustrated at the coating surface of the substrates or other objects 23. A throw distance h is measured between the object plane 46 and the target surface plane 44 of the cathode 12.

Figure 8A:
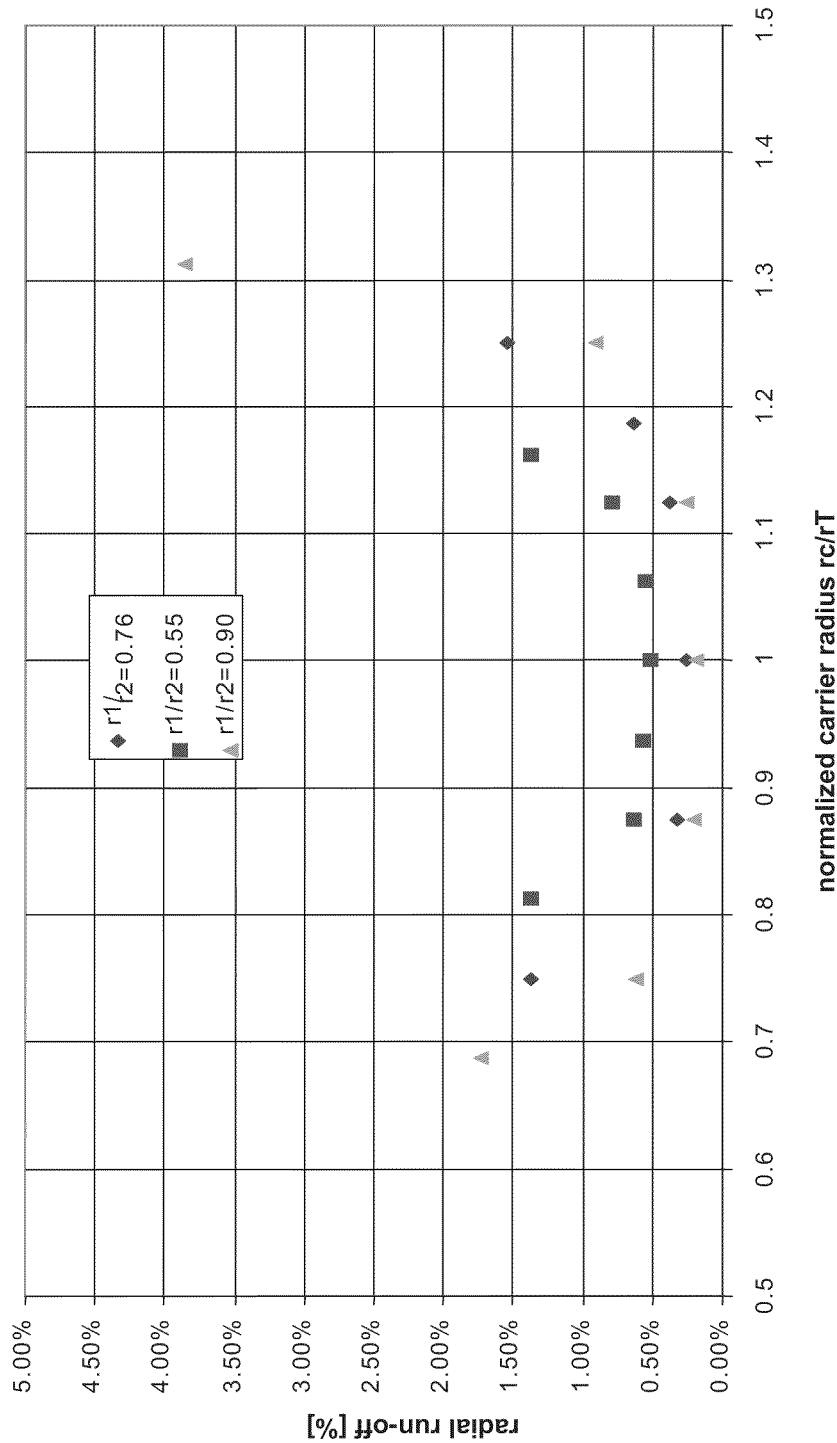
FIG. 8A is a graph of a calculated runoff versus a normalized carrier radius $r_C/r_T$.

The ring cathode 12 has a large radius r2, larger than the planet radius $r_W$. Depending on the planet size and number selected for coating, the cathode radius r2 can be optimized to maintain a required runoff. One other factor is the ring width. The cathode has an inner radius r1. The narrower the ring is, that is the larger r1/r2, the larger the rack or substrate 17 can be to achieve the same uniformity. A larger cathode radius requires a lower power density to achieve high deposition rates, despite a high total power in the cathode 12. This minimizes charge buildup on the target 24 and resultant arcing. The central axis Cc of the cathode 12 is translated an offset distance $r_T$ from the central axis C. This translation or offset distance $r_T$ is equal to between ⅔ and ⁴⁄₃ the carrier radius, $r_C$. A most preferred offset is equal to the carrier radius $r_C$, ($r_T=r_C$), while a range from 0.7 to 1.3 times the carrier radius achieves similar runoff control. These values vary with cathode ring width r1/r2 and the determined runoff limit as can be seen in FIG. 8A. The offset distance is varied in dependence on the substrate size or number of substrates to be coated.

Figure 4A:
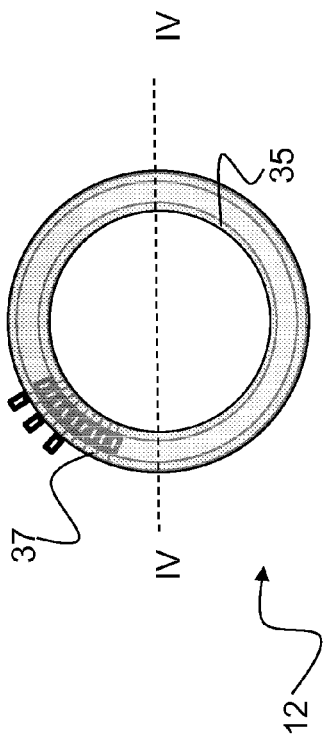
FIG. 4A is a top view of the ring shaped cathode.
Figure 4B:
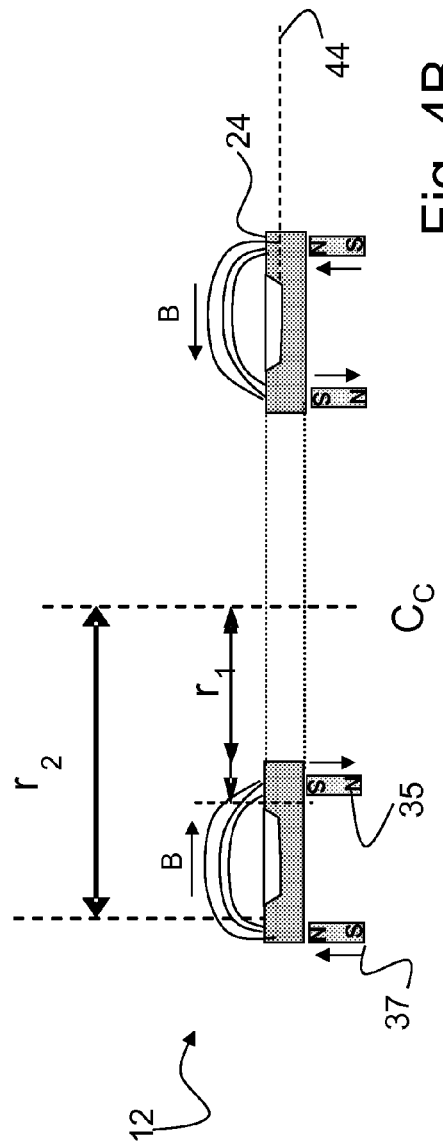
FIG. 4B is a cross-section of the ring shaped cathode taken through line IV-IV of FIG. 4A showing the target material, magnets and magnetic field lines.
Figure 6:
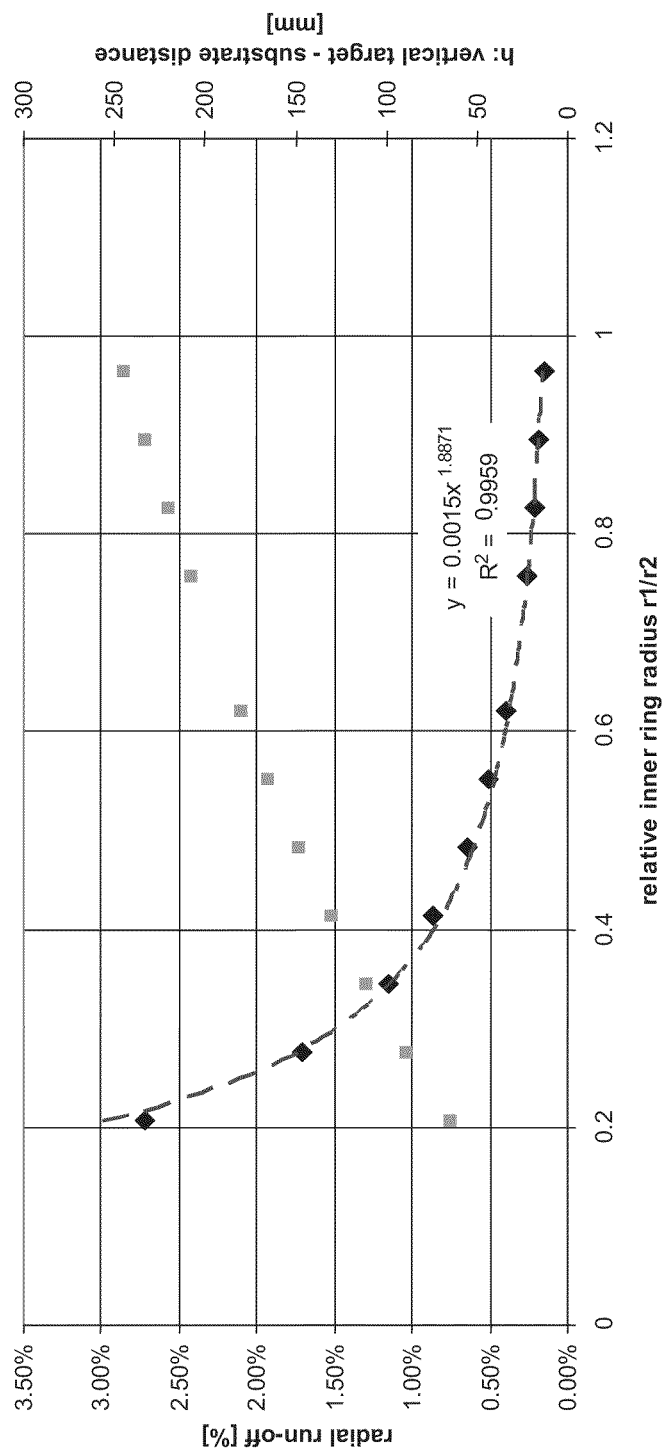
FIG. 6 is a graph of a calculated run-off for a variable inner radius to outer radius ratio of the ring shaped cathode.

The cathode 12 has an inner radius r1 and an outer radius r2, measured at the erosion zone of the target, shown clearly in FIG. 4B. Together these radii define a preferably narrow ring. Both the cathode 12 and the target 24 of coating material have substantially the same annular ring shape and dimension. An inner radius can be as large as 0.98*r2, and should be at least 0.25*r2. While improved results are seen at 0.55*r2. For a 300 mm substrate an optimum runoff is achieved with a narrow cathode ring of r1/r2 of 0.70 or larger. The outer radius r2 is dependent on the radius $r_W$ of the planets 17. The radius r2 is greater than the planet radius (r2>$r_W$) and ideally is 2 times the radius of the planet 17. The cathode radius can be larger than r2>2*$r_W$ though this depends on space limitations in the chamber. A larger radius (r2) ring cathode results in better coating uniformity when comparing rings of equal width (eg. r2−r1). This can be seen in FIG. 6. It is important to note that a large target by itself does not necessarily result in good uniformity. Simulation shows that circular (non-annular) high utilization cathodes result in poor uniformity. Simulation data is shown in FIG. 6. The performance of the geometry of the present invention had been predicted through numerical modeling. Simulations of this geometry show that for a given target and substrate size (outer radii) the narrower the race track ring, the better the coating uniformity across the substrate to a practical limit of approximately 0.98*r2 for the inner diameter r1. It has been further observed that larger diameter ring cathodes result in better coating uniformity when comparing rings of equal width. FIG. 6 presents a graph of radial runoff versus relative ring radius r1/r2, for a substrate size $r_W$/r2=0.69. The graph clearly shows the decreasing runoff as the ring narrows. A runoff of less than 2% is seen at r1/r2>0.25. A better runoff is predicted for a ring r1/r2>0.55. An ideal range appears to be between 0.9>r1/r2>0.55. On the opposite axis the throw distance h is plotted against the relative ring radius r1/r2. The throw distance h from target plane 44 to object plane 46 increasing from 90 mm to 240 mm from r1/r2=0.25 to r1/r2=0.9.

As shown in FIGS. 4A and 4B, the large ring cathode 12 includes an inner magnetic ring 35 and an outer magnetic ring 37. The ring target can be described as having an inner and outer racetrack radius. The racetrack of a magnetron cathode describes the area over which material is ejected. The main contributor to this pattern is the horizontal magnetic field strength in front of the target 24. The magnetic field is generated by the permanent magnets 35, 37 in two concentric rings below the target. The inner magnetic ring 35 having a radius substantially equal or smaller than r1, and the outer magnetic ring having a radius substantially equal or larger than r2. The two magnetic rings 35,37 have opposing polarity with their axes perpendicular to the surface 44 of the target 24. Due to the relatively narrow ring, high magnetic fields can be achieved which lead to low target voltage (between −250V and −650 V) and usually to lower stress in the deposited layers. In the large ring cathode there is enough space at the inside of the ring to include additional magnets to optimize the magnetic field shape for better target utilization. The cathode can be driven with any electrical mode, eg. RF, DC, pulsed DC, MF, dual cathode-AC, single cathode AC.

Figure 7A:
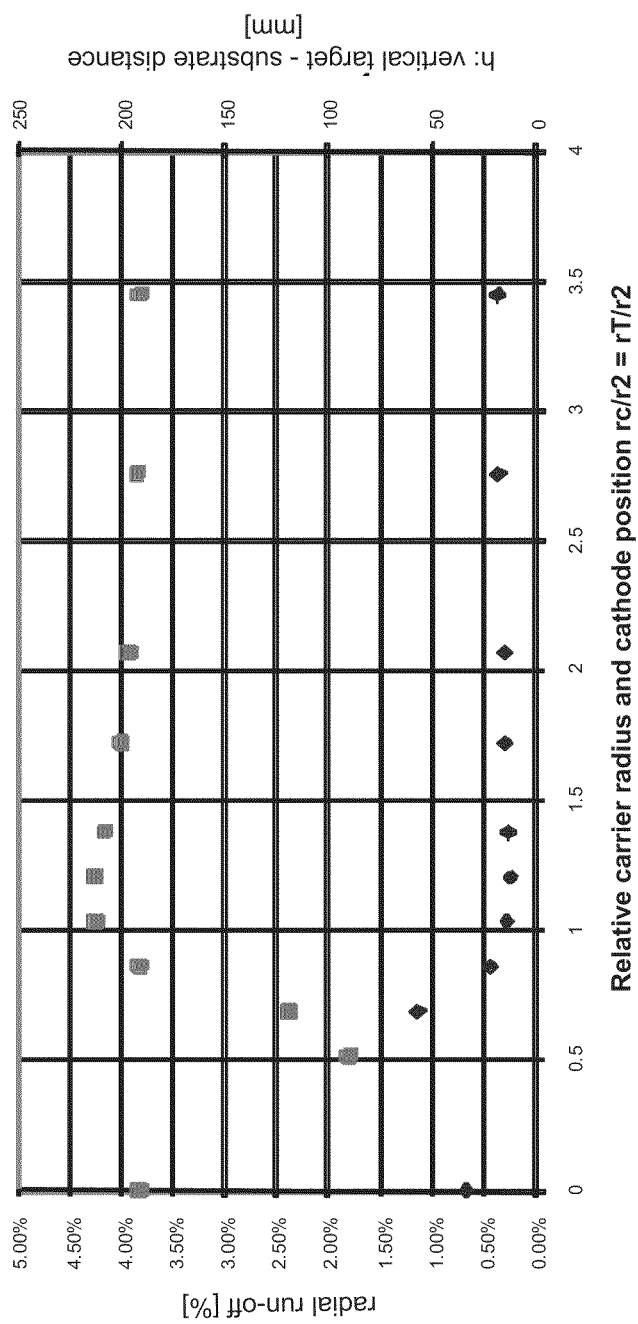
FIG. 7A is a graph of a calculated runoff and height versus a relative carrier radius and cathode position.
Figure 7B:
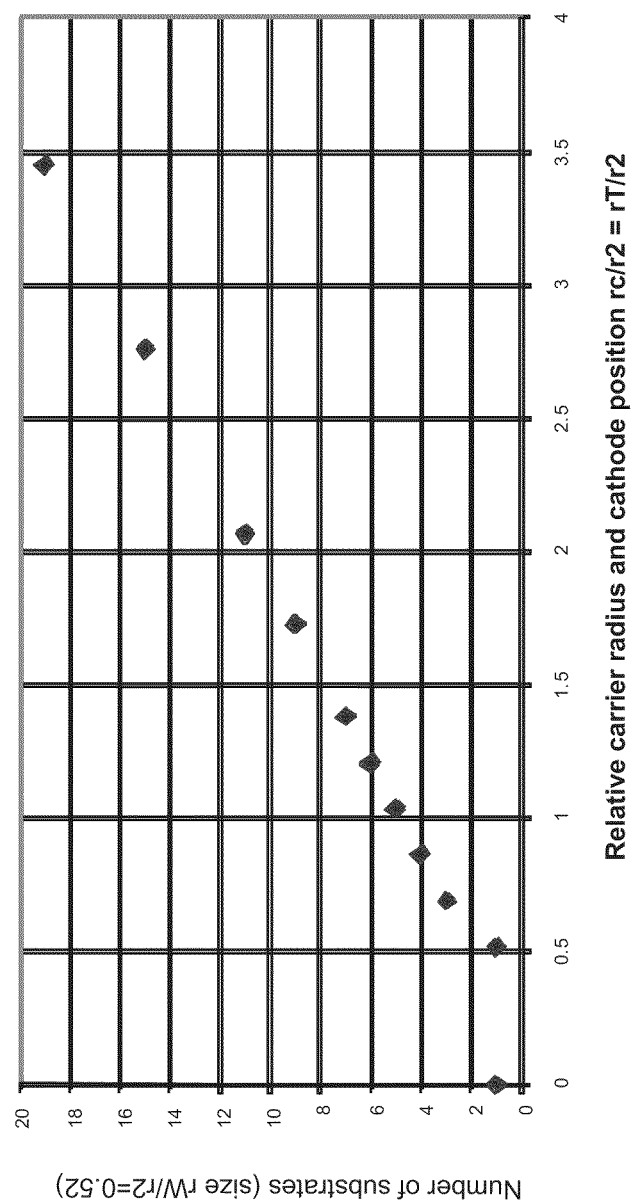
FIG. 7B is a graph of a calculated number of substrates for a relative carrier radius and cathode position.
Figure 8B:
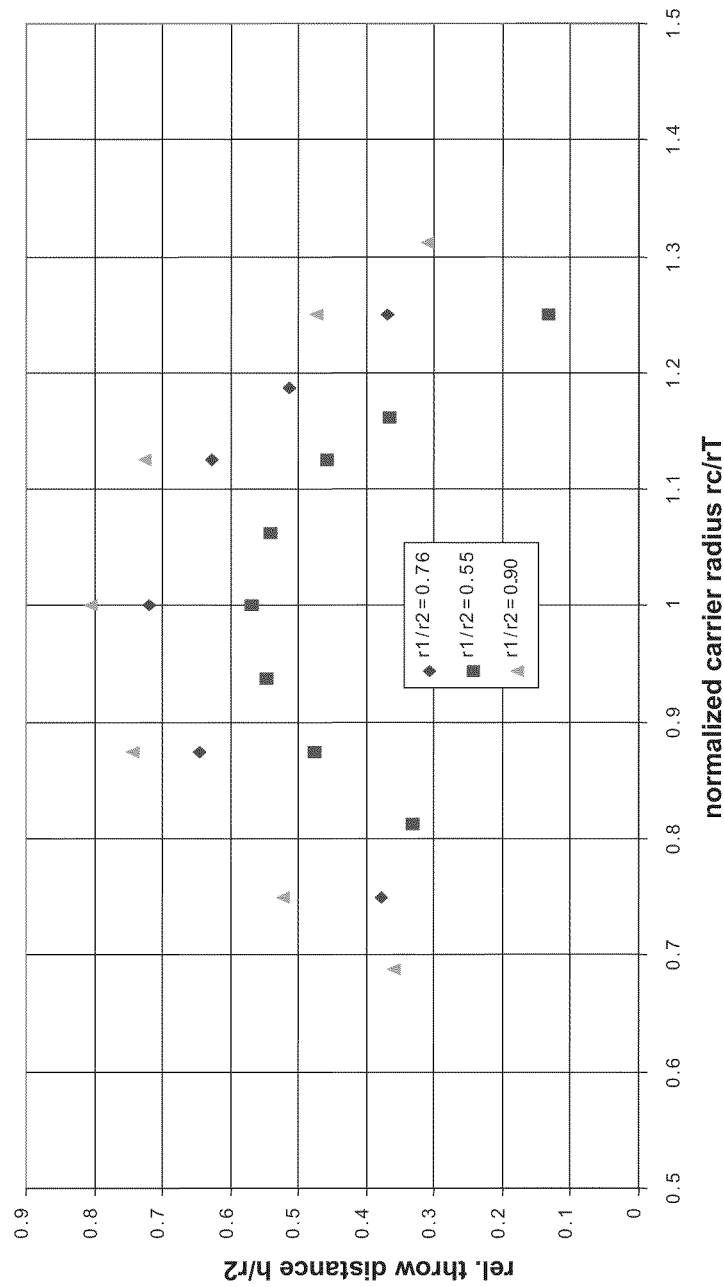
FIG. 8B is a graph of a calculated throw distance versus the normalized carrier radius $r_C/r_T$.

The geometry in accordance with the present invention permits the coating device to scale up for larger capacity without a large increase in throw distance. This helps maintain coating quality while increasing capacity. FIGS. 7A and 8A graphically demonstrates the effect on surface uniformity with increasing carrier radius $r_C$. FIG. 7B demonstrates the potential for increased number of planets, hence substrates, with the increased carrier radius $r_C$. FIG. 8B graphically demonstrates the optimized throw distance with increasing carrier radius. In FIG. 7 calculations are made with a constant r2 diameter of the cathode. In FIGS. 8A and 8B calculations are made with a fixed target position $r_T$, where $r_C=r_T$ is normalized. It can be seen from the graph in FIG. 8A that deviation from this optimum position, to increase load size or substrate dimensions, can be accommodated without a large impact on runoff. The graph in FIG. 8B shows the required increase in throw distance h for different target ring dimensions r1/r2 also made with a fixed target position normalized for $r_C$=rT. The throw distance impacts the coating rate and the efficiency of use of the target material. It also has an important effect on coating quality. The larger the target to substrate distance, the higher the probability that sputtered atoms will be scattered into the remaining working gas (argon and oxygen). The scatter leads to a reduction in energy of the sputtered particle and a change in direction. Both of these mechanisms have a negative impact on coating quality, causing rough coatings, and in the case of dielectric films haze and light scatter. The lower throw distance h in the present invention is significant in improving coating capacity and quality for larger coating capacity.

Figure 9A:
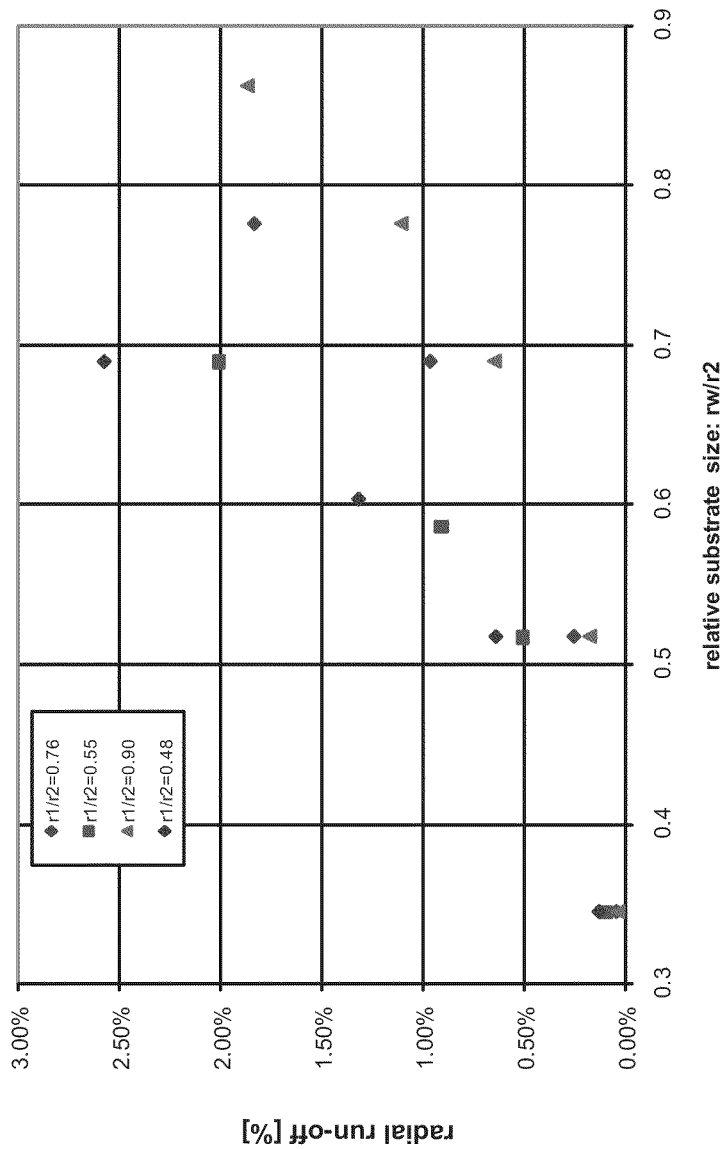
FIG. 9A is a graph of a calculated runoff versus relative substrate size rW/r2, for a range of cathode ring dimensions r1/r2.
Figure 9B:
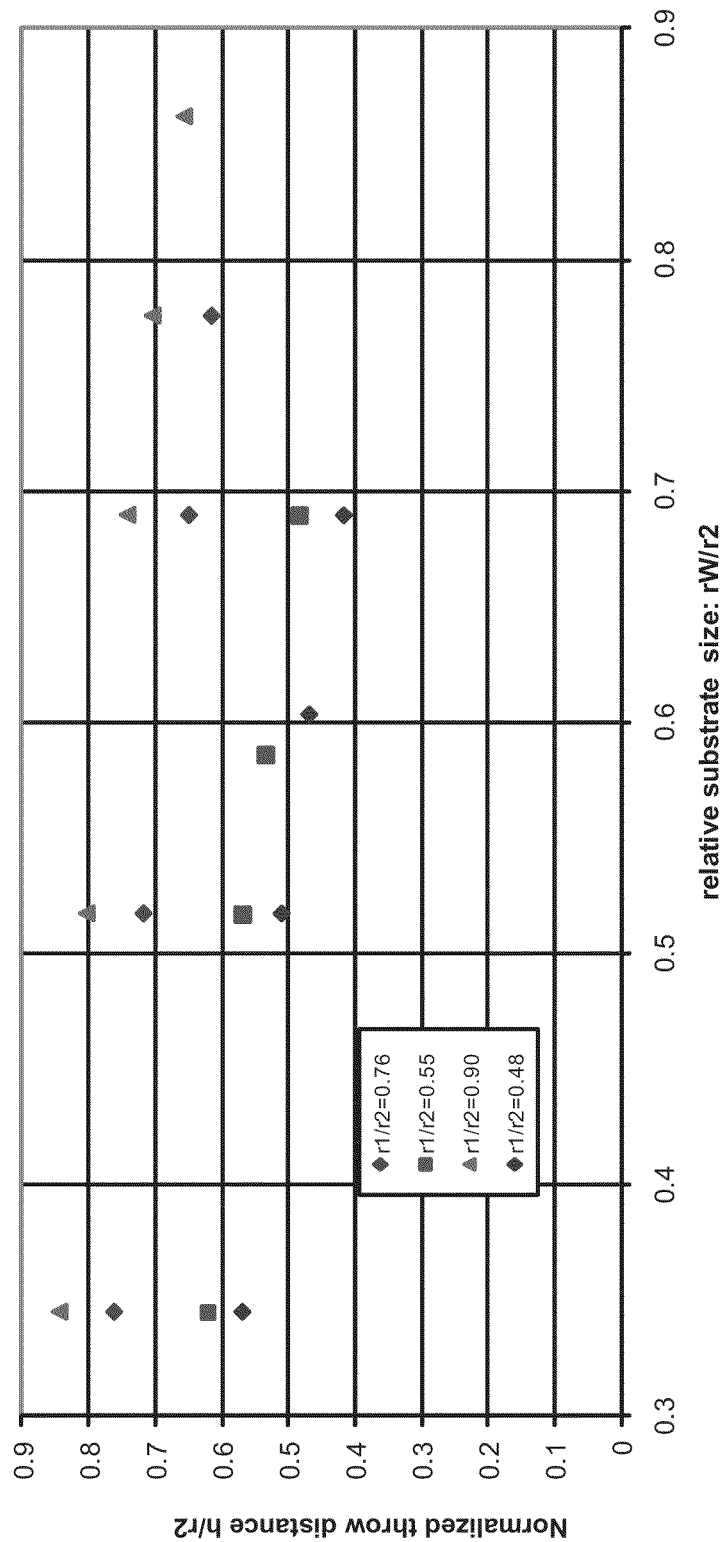
FIG. 9B is a graph of a calculated normalized throw distance h/r2 versus relative substrate size $r_W/r2$.

The graph in FIG. 9A demonstrates the impact of planet size $r_W$ on uniformity. It can be seen that the narrower the cathode ring, r1/r2=0.90, the larger the planet can be to achieve the same uniformity. For a runoff of 2%:
rw<0.67*r2 for r1/r2>=0.48 or r2>1.50*rw for r1/r2>=0.48
rw<0.69*r2 for r1/r2>=0.55 or r2>1.45*rw for r1/r2>=0.55
rw<0.80*r2 for r1/r2>=0.76 or r2>1.25*rw for r1/r2>=0.76
rw<0.90*r2 for r1/r2>=0.90 or r2>1.11*rw for r1/r2>=0.90

For a runoff of 0.5%:
rw<0.50*r2 for r1/r2>=0.48 or r2>2.00*rw for r1/r2>=0.48
rw<0.52*r2 for r1/r2>=0.55 or r2>1.92*rw for r1/r2>=0.55
rw<0.58*r2 for r1/r2>=0.76 or r2>1.72*rw for r1/r2>=0.76
rw<0.65*r2 for r1/r2>=0.90 or r2>1.54*rw for r1/r2>=0.90

Figure 10A:
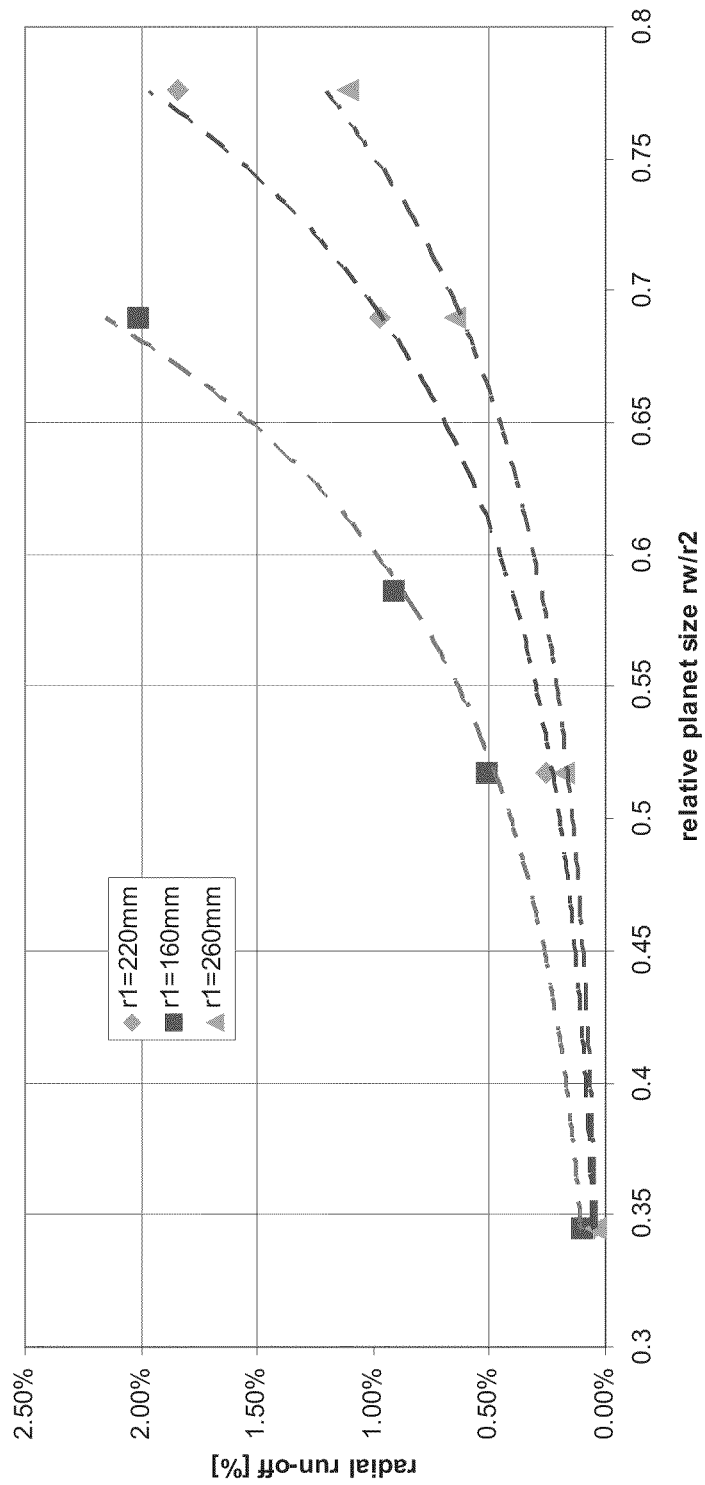
FIG. 10A is a graph of a calculated runoff versus relative planet size rW/r2.
Figure 10B:
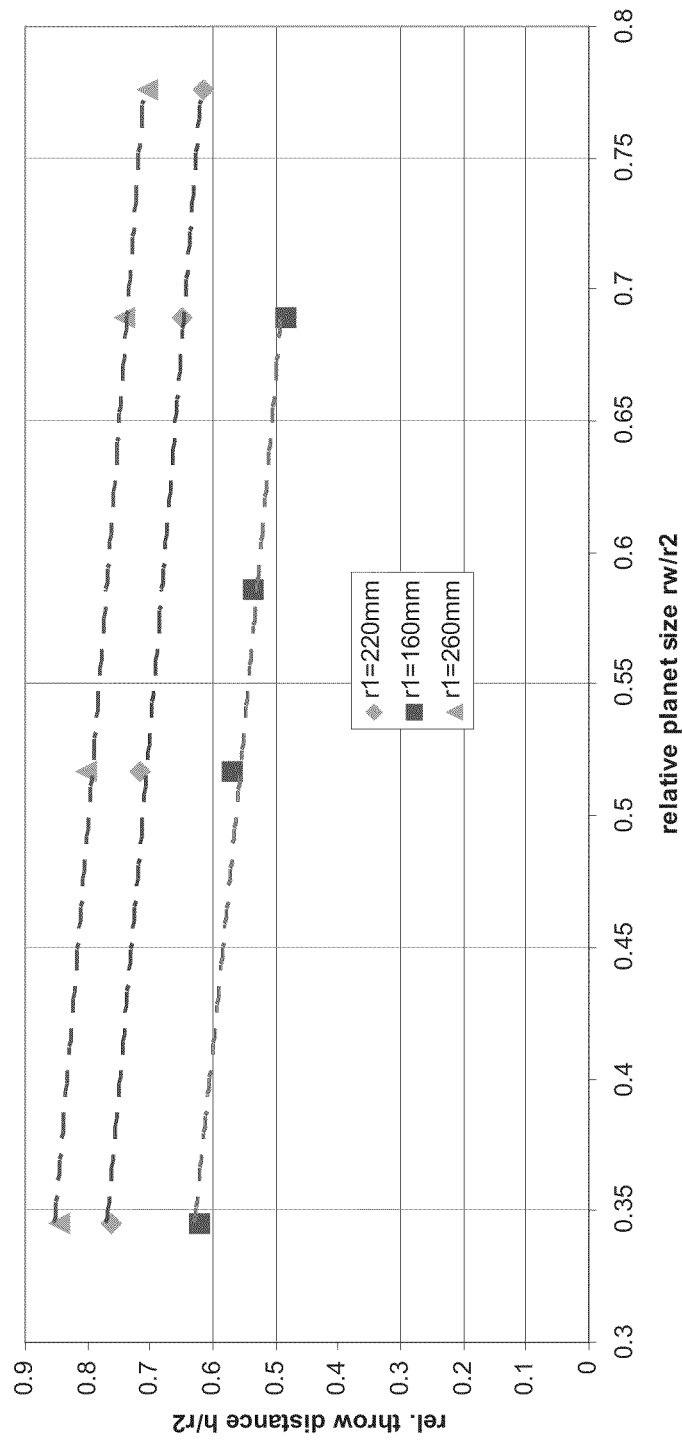
FIG. 10B is a graph of a calculated relative throw distance h/r2 versus relative planet size $r_W/r2$.

Similarly FIG. 10A illustrates the change in uniformity with planet size for different inner radius r1 of the target 24 and cathode 12. Again the narrowest ring (largest r1) results in the lowest runoff. FIG. 10B illustrates a relatively flat relative throw distance to cathode diameter (r2) with respect to relative planet size.

Figure 11:
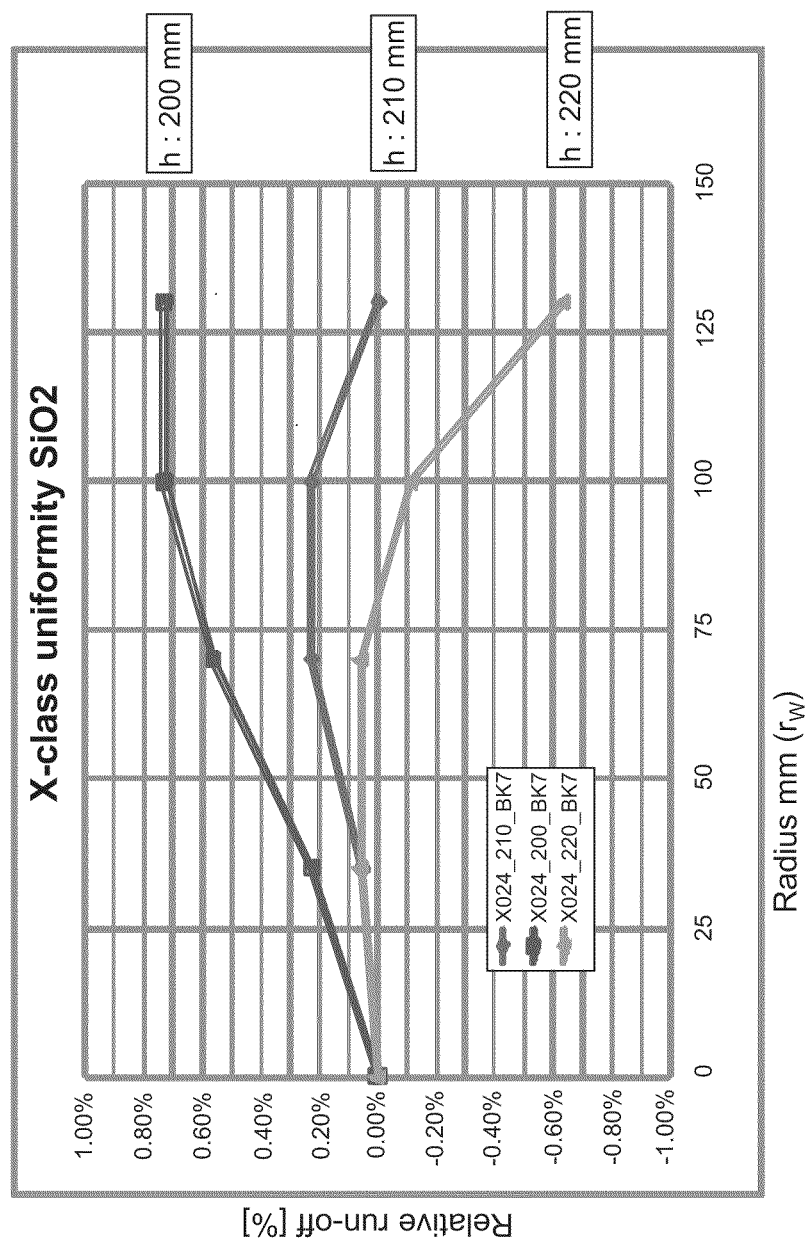
FIG. 11 is a graph of measured runoff for a device constructed in accordance with the present invention.

An example of this geometry has been constructed which includes seven 150 mm radius $r_W$ substrates and a ring cathode with an outer radius r2 of 290 mm. The inner cathode radius r1 is 220 mm and r1/r2 is 0.76. The carrier radius $r_C$ is equal to the offset distance $r_T$ at 400 mm. FIG. 11 shows data for this prototype demonstrating relative runoff with respect to position across a 300 mm substrate (rW+150 mm) for different throw distances h. A throw distance of 210 mm shows the best runoff results.

In a preferred embodiment, as shown in FIG. 1, two cathodes 12 are included in the coating chamber 2 with different targets 24 to provide different materials for multi layer coatings. Each cathode 12 is operated independently, while the idle cathode may be shuttered to avoid contamination. (not shown) Targets 24 can be, for example, silicon to form $SiO_2$ and a tantalum target to form $Ta_2O_5$. In order to fit two cathodes 12 in one chamber 2, the offset distance $r_T$ must be larger than the cathode outer diameter r2. Since the design is relatively insensitive to small changes in offset $r_T$, in this way additional and different target materials can be provided without sacrificing coating quality. The relationship $r_T$ of each cathode 12 to the planet drive 14 is the same. Thus multiple cathodes can be disposed in the chamber to provide additional materials or to decrease run time. Consideration of cross contamination between the different targets, available space in the coating chamber 2 and additional pump costs for a larger chamber will in part determine the number of cathodes.

Adjustments can be made to the position of the cathode 12 to alter the throw distance by movement of a mounting platform for the cathode 12 or the rotary drive 14, or both. This can be done manually or by activating a motor. Such adjustment can also be made to improve the geometry for different materials, or to maintain the distance as the target is eroded from use. The adjustment can be made with the process chamber under vacuum. A height adjustment mechanism in the planetary drive mounting or the cathode mounting allows throw distance compensation for different substrate or object thicknesses. In operation the height adjustment can provide continuous compensation for target erosion in order to maintain the correct throw distance h throughout a coating run.

For a standard layer thickness of about 100 nm the rotation speed of the planets 17 should be above 300 rpm. In case of very thin layers (about 10 nm) higher planet rotation speeds (>600 rpm) are required to result in good runoff. This assumes that the planetary drive 14 is rotating at 40-80 rpm.

Figure 5:
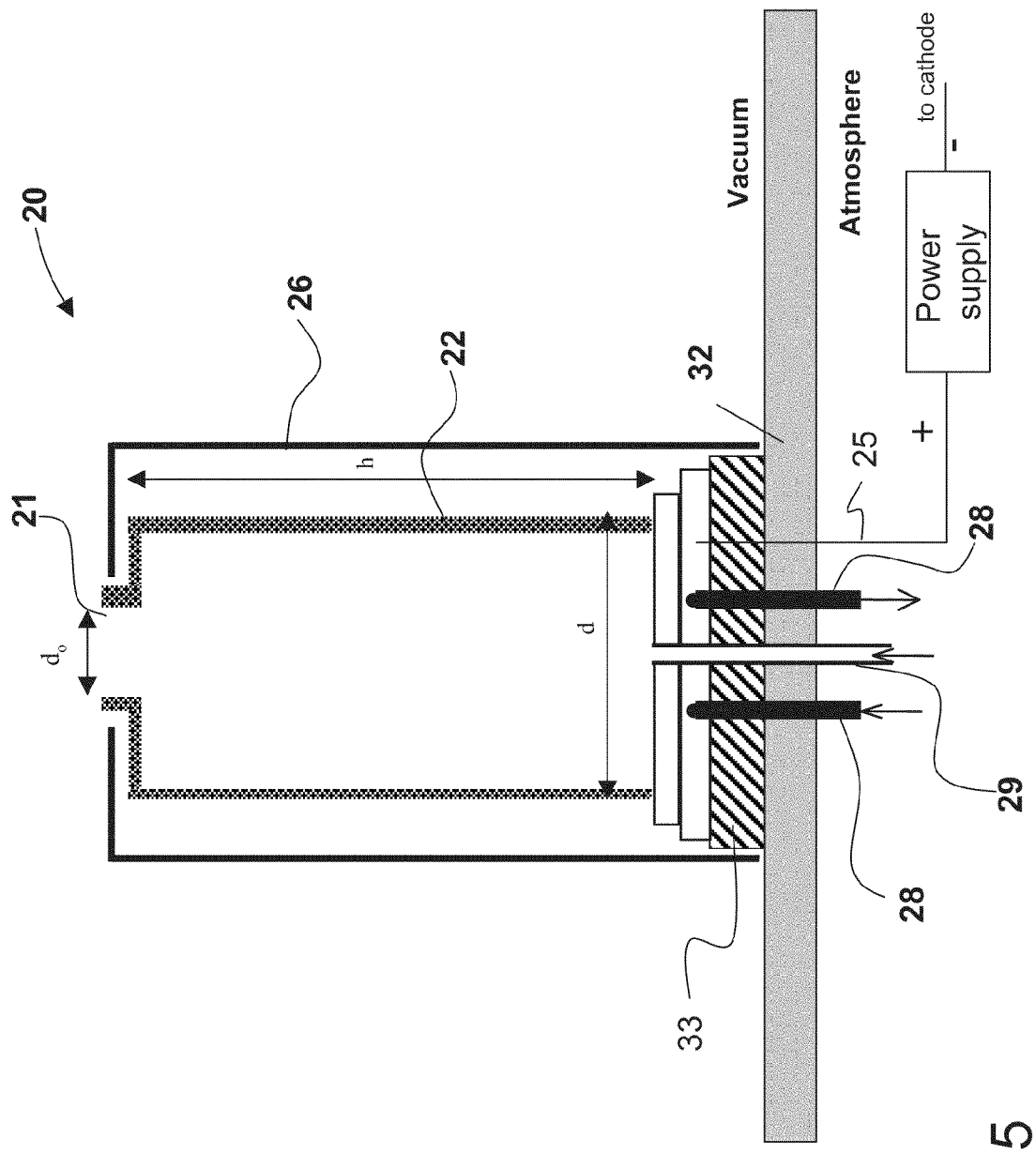
FIG. 5 is a cross-section of an anode vessel for use in the magnetron sputtering device.

The anode 20 provides a charge differential to the negatively charged cathode. A preferred anode 20 for use in the present invention, shown in detail in FIG. 5, is disclosed in related application U.S. Ser. No. 11/074,249 filed Mar. 7, 2005 and owned by the assignee of the present invention, herein incorporated by reference. Referring now to FIG. 5 an anode 20 is shown in the form of a container or vessel having inner conductive surface of copper or stainless steel 22 having an opening 21 at a first end for communicating with a vacuum chamber 2 to which it is directly coupled. The outer surface 26 of the container 20 is electrically insulated. In the cross sectional view water cooling pipes 28 are shown substantially around the anode 20 for maintaining the temperature of the anode in operation. A gas inlet port 29 is shown for providing a conduit into which sputter gas may enter the anode vessel. The size of the opening 21 and the flow of sputter gas can be selected to locally pressurize the anode 20. The anode body 20 can be disposed external to or within the vacuum coating chamber 2. Furthermore, the opening 21 can be located on a side or end of the anode vessel. The relatively small opening 21, significantly smaller than the circumference of the vessel, and the location of the opening 21 out of a line of sight to the target prevent coating material from entering and coating the inner conductive surface of the anode vessel. In operation the anode 20 is pressurized with argon gas which promotes the formation of plasma in the coating chamber 2 in the presence of a suitable ignition voltage and maintenance voltage thereafter. Pressure within the vessel 20, higher than the rest of the vacuum coating chamber 2, allows for a lower anode voltage and a more stable sputtering condition. Positive power supply lead 25 connects the power supply to the inner conductive walls 22 of the anode 20. The anode shown in FIG. 5 was designed to function with a low anode voltage and little or no arcing. A low anode voltage of approximately +15 to +60 volts is preferred to reduce process variation. The anode 20 is electrically insulated from the grounded chamber walls 32 by an insulating material 33.

In a preferred embodiment the anode comprises a vessel of cylindrical shape with a diameter of at least d=10 cm and a length of at least h=20 cm with an opening (21) to the vacuum chamber (2) at one end as shown in FIG. 5 and closed at the opposite end. For low scattering processes the chamber pressure is below 0.267 Pa (2 mTorr.) A higher pressure at the anode is achieved by a constricted opening 21 of the anode 20 and a controlled flow of process gas into the anode 20 via the inlet port 29. An optimum opening has an area of about 20 $cm^2$ and is preferably round. In operation the anode 20 can be pressurized to more than 0.400 Pa (3 mTorr.) This anode 20 can run in nearly continuous operation for extended periods of time. The anode vessel 20 can be conveniently located in the chamber walls 32 adjacent the cathode 12 as shown in FIG. 1 also serving as the source of sputter gas.

An anode vessel 20 can be integrated into the center of the ring cathode, as shown in FIG. 2, since the anode opening is relatively far away from strong magnetic fields. This improves the symmetry of the system, which improves target utilization.

Many optical coatings require the deposition of oxides or other compounds. Such materials are preferably produced in reactive sputter mode where a metallic target is sputtered and oxygen, nitrogen, or another reactive gas is added to the process. The sputtered material and the activated oxygen species arrive simultaneously at the substrate. The optimum flow, of oxygen for example, for the optimum oxygen partial pressure needs to be found. If the oxygen flow is too low, the films are not stoichiometric and have high absorption losses. If it is too high, the target surface becomes more oxidized than necessary preventing operation at the highest possible deposition rate. The sputter rate for a metallic target can be ten times higher than that of a fully oxidized target. In its basic form, the reactive gas flows through a mass flow controller and enters the coating chamber through a simple gas line or a complex manifold. The oxidation effectiveness can be increased if the oxygen is activated and directed at the substrates, thus increasing the possible deposition rate.

In the preferred embodiment of this aspect of the invention the output orifice of an inductively coupled reactive activation source 36, is located in the center of the ring cathode 12. Experiments have shown that higher deposition rates of metal oxides with low absorption can be achieved when the plume of sputtered material from the target and the plume of activated and ionized oxygen overlap and simultaneously arrive at the substrate to be coated. Thus, having the reactive gas source 36 in the center of the target is an almost ideal solution. The use of a directed oxygen activation or acceleration device 36 shown in FIG. 1 helps the formation of stoichiometric films while minimizing the target oxidation. Such a device can be an inductively or capacitively coupled plasma source with or without an extraction or acceleration system. The source output can be ionized or otherwise activated oxygen species (e.g. atomic oxygen, ozone). Examples include the JDSU PAS source, a Taurion source from ProVac, an APS source from Leybold, or other commercially available ion or activation sources. The activated oxygen source 36 is positioned just at the target surface plane 44 in the center of the cathode 12. If the activated reactive source is separated from the cathode, it should be directed such that the cathode 12 is between the oxygen source 36 and the object plane 46 to be outside the line of sight from the sputtered target surface 24, as it is important to prevent massive coating buildup at the oxygen source 36. As shown in FIG. 2C, the oxygen source 36 can be mounted on a radius $r_C$ from C with its opening tilted toward the direction of the target 24 and planet 17. The opening should be at a vertical distance greater than or equal to h from the object plane 46. A distance h is preferred. Moving the target surface plane 44 close to the object plane 46 as enabled by the present geometry allows positioning the oxygen activation source 36 closer to the substrates 23 while keeping it free from massive coating buildup. That increases the oxidation effectiveness and allows to coat at higher rates. The reactive sputter process is disclosed for oxides. All aspects can similarly be applied to nitrides or other reactive processes.

In a further preferred embodiment the anode vessel 20 has been found to be a suitable structure to provide an activated reactive gas. We observed that the anode vessel 20 in its typical arrangement contains a plasma. The plasma is ignited by the high density of electrons coming from the cathode 12 and returning to the power supply through the anode 20. The effect of ion creation and the creation of activated species is similar to the reactions occurring at the cathode: energetic e−+Ar=≧2e−+Ar+ or energetic e−+Ar=>e−+Ar*. There would not be visible plasma at the anode without this activation of the argon atoms. We decided to test adding oxygen to the anode to test if it would generate activated and ionized oxygen. By coupling the oxygen feed into the anode vessel 20', we were able to deposit a clear $SiO_2$ single layer. This is a clear indication that the anode operating with argon and oxygen is behaving as an anode and an activated reactive gas source. Additionally, we did not observe oxidation of the inside walls of the anode. The configuration is shown in FIG. 2A. When anode and oxidation source are separate, a big variation of target wear is observed which limits the target utilization. On the side close to the oxidation source the target wear is low, due to an increase of target oxidation, whereas on the side which is close to the anode the target wear is high, due to an increase in plasma density. By including the anode 20 in the center of the cathode 12 one source of asymmetry is eliminated. By including the oxygen source in the anode vessel 20' together in the center of the cathode 12, a very symmetric system is created and target wear is expected to be uniform. An auxiliary activated reactive source located a distance from the cathode 12 (eg. at 20 as shown in FIG. 1) can be provided in addition to enable a higher deposition rate.

What is claimed is:

1. A magnetron sputtering device including:
a planetary drive system having a central rotation axis C for primary rotation, and supporting a plurality of planets, each planet having a secondary axis of rotation at a planet center point $C_s$, and each planet representing a coating area described by $r_w$ the planet radius, the planetary drive system having a carrier radius $r_C$ from the central rotation axis C to a planet center point $C_s$;
a ring shaped cathode including a ring shaped target comprising material for forming a coating, the cathode having a center point Cc, an outer radius $r_2$ greater than the planet radius ($r_2 > r_W$), an inner radius $r_1$ greater than one quarter of the outer radius ($r_2 > r_1 > \frac{1}{4} * r_2$);
wherein the cathode center point Cc is disposed an offset distance $r_T$ between ⅔ and ⅘ of the carrier radius $r_C$ from the central rotation axis C ($\frac{2}{3}*r_C < r_T < \frac{4}{5}*r_C$), and the offset distance $r_T$ is greater than one half the outer radius of the cathode ($r_T > \frac{1}{2}*r_2$);
and wherein a throw distance h vertically from a target surface to a planet surface is between one third of the outer radius $r_2$ of the cathode and one times the outer radius of the cathode ($\frac{1}{3}*r_2 < h < r_2$);
a chamber for housing the cathode and the planetary drive system adapted to be evacuated in operation; and
a gas delivery system for providing a flow of sputter gas into the chamber.

2. The magnetron sputtering device as defined in claim 1 for providing a sputter coating to a substrate without the use of a mask.

3. The magnetron sputtering device as defined in claim 2, further including an anode for providing a voltage difference to the cathode, such that the anode is a return path for electrons, the anode comprising an interior conductive surface of a vessel having an insulated outer surface electrically isolated from the chamber walls, the vessel having an opening in communication with a chamber interior, the opening being smaller than a circumference of the vessel to shield the interior conductive surface from most sputtered material.

4. The magnetron sputtering device as defined in claim 3, wherein a source for sputtering gas is coupled into the vessel for providing sputtering gas through the opening into the chamber, and the opening is dimensioned to permit a flow of gas to increase the pressure locally within the anode vessel above the pressure of the evacuated chamber.

5. The magnetron sputtering device as defined in claim 2, further including an activated source for a reactive gas.

6. The magnetron sputtering device as defined in claim 4, further including an activated source for a reactive gas.

7. The magnetron sputtering device as defined in claim 4, wherein the anode is located such that the opening of the vessel in communication with the chamber interior is at the center of the ring shaped cathode.

8. The magnetron sputtering device as defined in claim 5, wherein the activated source for a reactive gas is located at the center of the ring shaped cathode.

9. The magnetron sputtering device as defined in claim 6, wherein the anode is located such that the opening of the vessel in communication with the chamber interior is at the center of the ring shaped cathode.

10. The magnetron sputtering device as defined in claim 6, wherein the activated source for a reactive gas is located at the center of the ring shaped cathode.

11. The magnetron sputtering device as defined in claim 4, wherein the anode further includes a source for a reactive gas coupled into the vessel for providing an activated reactive gas together with the sputtering gas through the opening into the chamber.

12. The magnetron sputtering device as defined in claim 11, wherein the opening into the chamber of the vessel comprising the anode is located at the center of the ring shaped cathode.

13. The magnetron sputtering device as defined in claim 12, further including an auxiliary activated reactive source located a distance from the cathode.

14. The magnetron sputtering device as defined in claim 1 wherein the inner radius $r_1$ is greater than ½ the outer radius $r_2$, such that $r_2 > r_1 > \frac{1}{2} * r_2$.

15. The magnetron sputtering device as defined in claim 1 wherein the inner radius $r_1$ is greater than 0.70 of the outer radius $r_2$, such that $r_2 > r_1 > 0.70 * r_2$.

16. The magnetron sputtering device as defined in claim 1 wherein $0.95 * r_2 > r_1 > 0.6 * r_2$.

17. The magnetron sputtering device as defined in claim 1, wherein the cathode diameter $r_2$ is equal to or larger than 1.11 times the planet radius ($r_2 > 1.11 * r_W$).

18. The magnetron sputtering device as defined in claim 1 wherein the cathode includes inner and outer concentric rings of permanent magnetic material on a side opposite to the target material of the cathode, the inner and outer concentric rings having opposite polarity with their axes perpendicular to a surface of the target for providing a magnetic field close to a surface of the target.

19. A magnetron sputtering device as defined in claim 1 further including within the chamber one or more alternate ring shaped cathode including a ring shaped target comprising material for forming a coating, wherein the offset distance $r_T$ is greater than one times the outer radius $r_2$ ($r_T > 1 * r_2$).

20. A magnetron sputtering device as defined in claim 1 further including means for adjusting the throw distance between a target surface plane and the object plane.

21. A magnetron sputtering device as defined in claim 1 wherein the carrier radius $r_C$ is equal to the offset distance $r_T$ ($r_T = r_C$).

* * * * *